United States Patent
Cowley et al.

(10) Patent No.: US 9,577,581 B2
(45) Date of Patent: Feb. 21, 2017

(54) SIGNAL AMPLIFIER WITH ACTIVE POWER MANAGEMENT

(75) Inventors: Nicholas P. Cowley, Wroughton (GB); Isaac Ali, Mississauga (CA); William L. Barber, Bampton (GB)

(73) Assignee: Intel Corporation, Santa Clara, CA (US)

( * ) Notice: Subject to any disclaimer, the term of this patent is extended or adjusted under 35 U.S.C. 154(b) by 162 days.

(21) Appl. No.: 13/996,035

(22) PCT Filed: Apr. 19, 2012

(86) PCT No.: PCT/US2012/034211
§ 371 (c)(1),
(2), (4) Date: Dec. 10, 2014

(87) PCT Pub. No.: WO2013/158101
PCT Pub. Date: Oct. 24, 2013

(65) Prior Publication Data
US 2015/0155833 A1 Jun. 4, 2015

(51) Int. Cl.
*H01Q 11/12* (2006.01)
*H03F 1/02* (2006.01)
(Continued)

(52) U.S. Cl.
CPC .......... *H03F 1/0227* (2013.01); *H03F 1/3241* (2013.01); *H03F 3/195* (2013.01);
(Continued)

(58) Field of Classification Search
None
See application file for complete search history.

(56) References Cited

U.S. PATENT DOCUMENTS 6,028,478 A * 2/2000 Seremeta ................ G05F 3/225
330/252
6,229,374 B1 * 5/2001 Tammone, Jr. ....... H03G 1/0023
327/359
(Continued)

FOREIGN PATENT DOCUMENTS

CN 1640081 A 7/2005
CN 1689295 A 10/2005
(Continued)

OTHER PUBLICATIONS

Office Action received for China Patent Application No. 201280071852.9, mailed Mar. 23, 2016, 19 pages of English translation and 10 pages of China Office Action.
(Continued)

*Primary Examiner* — Lana N Le
(74) *Attorney, Agent, or Firm* — Grossman, Tucker, Perreault & Pfleger, PLLC (57) ABSTRACT

A system for amplifying a signal with active power management according to one embodiment includes a first digital to analog converter (DAC) circuit configured to provide a modulated carrier signal; a amplifier circuit coupled to the first DAC, where the amplifier circuit is configured to amplify the modulated carrier signal; an output stage circuit coupled to the amplifier circuit, where the output stage circuit is configured to provide the amplified signal to a network; a second DAC circuit configured to provide a full wave rectified envelope of the modulated carrier signal; and a switching regulator circuit including a voltage reference input coupled to the second DAC circuit, where the switching regulator circuit is configured to provide a supply voltage to the output stage circuit and the supply voltage is modulated in response to the envelope received at the voltage reference input.

36 Claims, 7 Drawing Sheets (51) Int. Cl.
*H03F 1/32* (2006.01)
*H03F 3/195* (2006.01)
*H03F 3/24* (2006.01)
*H04L 25/02* (2006.01)
*H04L 27/36* (2006.01)
*H03G 3/30* (2006.01)

(52) U.S. Cl.
CPC ............... *H03F 3/245* (2013.01); *H03G 3/30* (2013.01); *H04L 25/0264* (2013.01); *H04L 25/0272* (2013.01); *H04L 27/361* (2013.01); *H03F 2200/09* (2013.01); *H03F 2200/102* (2013.01); *H03F 2200/333* (2013.01); *H03F 2200/411* (2013.01); *H03F 2200/504* (2013.01); *H03F 2200/541* (2013.01)

(56) References Cited

U.S. PATENT DOCUMENTS

| | | | |
|---|---|---|---|
| 6,591,093 B1* | 7/2003 | Coffing | H03D 7/1425 455/131 |
| 7,135,918 B1 | 11/2006 | Outaleb et al. | |
| 7,970,362 B2 | 6/2011 | Minnis et al. | |
| 2006/0270366 A1* | 11/2006 | Rozenblit | H03F 1/0205 455/127.1 |
| 2008/0136515 A1 | 6/2008 | Magoon et al. | |
| 2008/0233904 A1 | 9/2008 | Suzuki et al. | |
| 2010/0208602 A1* | 8/2010 | Stolt | H04L 1/0003 370/252 |
| 2010/0264984 A1* | 10/2010 | Gomez | H03F 1/52 330/124 R |
| 2011/0223875 A1 | 9/2011 | Hamano | |
| 2012/0157010 A1* | 6/2012 | Fukuoka | H03F 1/0205 455/73 |
| 2012/0164963 A1* | 6/2012 | Rofougaran | H03G 1/0029 455/127.2 |
| 2013/0005272 A1* | 1/2013 | Shah | H04B 1/70754 455/67.11 |
| 2013/0185581 A1* | 7/2013 | Michalak | G06F 9/5094 713/340 |
| 2014/0010385 A1* | 1/2014 | Mate | H03F 3/183 455/171.1 |
| 2014/0191740 A1* | 7/2014 | Ferrario | H02M 3/156 323/282 |

FOREIGN PATENT DOCUMENTS

| | | |
|---|---|---|
| CN | 101233681 A | 7/2008 |
| WO | 2013/158101 A1 | 10/2013 |

OTHER PUBLICATIONS

International Preliminary Report on Patentability and Written Opinion received for PCT Patent Application No. PCT/US2012/034211, mailed on Oct. 30, 2014, 8 pages.

International Search Report and Written Opinion received for PCT Patent Application No. PCT/US2012/034211, mailed on Dec. 26, 2012, 14 pages.

Office Action received for China Patent Application No. 201280071852.9, mailed Dec. 5, 2016, 15 pages of English translation and 10 pages of China Office Action.

* cited by examiner

SIGNAL AMPLIFIER WITH ACTIVE POWER MANAGEMENT

FIELD

The present disclosure relates to signal amplifiers, and more particularly, to signal amplifiers with active power management.

BACKGROUND

Power amplifiers are typically used to amplify a signal prior to transmission over a network, such as, for example, a cable network or a wireless network, and power management is an issue of growing concern as systems increase in complexity while decreasing in size. This is especially true for battery operated systems. Additionally, some types of network receivers and/or protocols impose requirements on received power levels at the receiver regardless of the distance from the transmitter. Transmitters may therefore need to adjust their output levels using, for example, a programmable gain amplifier that is continuously adjustable over a range of amplitudes. Furthermore, some types of transmission are intermittent, for example, time multiplexed transmission.

There exists a class of transmitters that use amplifiers which employ a transconductance stage (a voltage controlled current source) coupled to an output stage. The output stage typically requires a voltage supply for the output stage that requires a DC offset to prevent saturation of the transconductance stage. The output stage, therefore, consumes power at a relatively high rate that is related to the maximum signal amplitude that may be transmitted rather than the instantaneous signal amplitude. Thus, power is wasted during times when the system is transmitting at reduced amplitudes or not transmitting at all.

BRIEF DESCRIPTION OF THE DRAWINGS

Features and advantages of embodiments of the claimed subject matter will become apparent as the following Detailed Description proceeds, and upon reference to the Drawings, wherein like numerals depict like parts, and in which:

Although the following Detailed Description will proceed with reference being made to illustrative embodiments, many alternatives, modifications, and variations thereof will be apparent to those skilled in the art.

DETAILED DESCRIPTION

Generally, this disclosure provides systems and methods for actively managing the power usage of an amplifier system associated with the transmission of signals at varying power levels. This may be accomplished by modulating the supply voltage for the output stage of the amplifier system in response to the variation of the envelope of the modulated carrier signal that is to be transmitted. The supply voltage for the output stage may be provided by a switching regulator having a voltage reference input that is driven by a full wave rectified envelope of the modulated carrier signal. In some embodiments, the switching regulator may be a Buck converter, a Boost converter or a Buck-Boost converter.

Some embodiments may be used in conjunction with one or more types of wireless communication signals and/or systems, for example, Radio Frequency (RF), Infra Red (IR), Frequency-Division Multiplexing (FDM), Orthogonal FDM (OFDM), Time-Division Multiplexing (TDM), Time-Division Multiple Access (TDMA), Extended TDMA (E-TDMA), General Packet Radio Service (GPRS), extended GPRS, Code-Division Multiple Access (CDMA), Wideband CDMA (WCDMA), CDMA 2000, single-carrier CDMA, multi-carrier CDMA, Multi-Carrier Modulation (MDM), Discrete Multi-Tone (DMT), Bluetooth®, Global Positioning System (GPS), Wi-Fi, Wi-Max, Wireless Metropolitan Area Networks (WMAN), Wireless Wide Area Networks (WWAN), ZigBee™, Ultra-Wideband (UWB), Global System for Mobile communication (GSM), 2G, 2.5G, 3G, 3.5G, Enhanced Data rates for GSM Evolution (EDGE), or the like. Other embodiments may be used in various other devices, systems and/or networks.

Some embodiments may be used in conjunction with suitable limited-range or short-range wireless communication networks, for example, "piconets", e.g., a wireless area network, a WVAN, a WPAN, and the like.

Some embodiments may be used in conjunction with various devices and systems, for example, a video device, an audio device, an audio-video (A/V) device, a Set-Top-Box (STB), a Blu-ray disc (BD) player, a BD recorder, a Digital Video Disc (DVD) player, a High Definition (HD) DVD player, a DVD recorder, a HD DVD recorder, a Personal Video Recorder (PVR), a broadcast HD receiver, a video source, an audio source, a video sink, an audio sink, a stereo tuner, a broadcast radio receiver, a display, a flat panel display, a Personal Media Player (PMP), a digital video camera (DVC), a digital audio player, a speaker, an audio receiver, an audio amplifier, a data source, a data sink, a Digital Still camera (DSC), a Personal Computer (PC), a desktop computer, a mobile computer, a laptop computer, a notebook computer, a tablet computer, a smartphone, a digital television, a server computer, a handheld computer, a handheld device, a Personal Digital Assistant (PDA) device, a handheld PDA device, an on-board device, an off-board device, a hybrid device, a vehicular device, a non-vehicular device, a mobile or portable device, a consumer device, a non-mobile or non-portable device, a wireless communication station, a wireless communication device, a wireless access point (AP), a wired or wireless router, a wired or wireless modem, a wired or wireless network, a wireless area network, a Wireless Video Are Network (WVAN), a Local Area Network (LAN), a WLAN, a PAN, a WPAN, devices and/or networks operating in accordance with existing Wireless HD™ and/or Wireless-Gigabit-Alliance (WGA) specifications and/or future versions and/or derivatives thereof, devices and/or networks operating in accordance with existing IEEE 802.11 (IEEE 802.11-2007: Wireless LAN Medium Access Control (MAC) and Physical Layer (PHY) Specifications) standards and amendments ("the IEEE 802.11 standards"), IEEE 802.16 standards for Worldwide Interoperability for Microwave Access (Wi-MAX), Third Generation Partnership Project (3GPP) including Long Term Evolution (LTE) and Long Term Evolution Advanced (LTE-A) and/or future versions and/or derivatives thereof, units and/or devices which are part of the above networks, one way and/or two-way radio communication systems, cellular radio-telephone communication systems, Wireless-Display (WiDi) device, a cellular telephone, a wireless telephone, a Personal Communication Systems (PCS) device, a PDA device which incorporates a wireless communication device, a mobile or portable Global Positioning System (GPS) device, a device which incorporates a GPS receiver or transceiver or chip, a device which incorporates an RFID element or chip, a Multiple Input Multiple Output (MIMO) transceiver or device, a Single Input Multiple Output (SIMO) transceiver or device, a Multiple Input Single Output (MISO) transceiver or device, a device having one or more internal antennas and/or external antennas, Digital Video Broadcast (DVB) devices or systems, multi-standard radio devices or systems, a wired or wireless handheld device (e.g., BlackBerry, Palm Treo), a Wireless Application Protocol (WAP) device, or the like.

The term "wireless device" as used herein includes, for example, a device capable of wireless communication, a communication device capable of wireless communication, a communication station capable of wireless communication, a portable or non-portable device capable of wireless communication, or the like. In some embodiments, a wireless device may be or may include a peripheral device that is integrated with a computer, or a peripheral device that is attached to a computer. In some embodiments, the term "wireless device" may optionally include a wireless service.

It should be understood that the present invention may be used in a variety of applications. Although the present invention is not limited in this respect, the circuits and techniques disclosed herein may be used in many apparatuses such as stations of a radio system or nodes on a cable network. Stations intended to be included within the scope of the present invention include, by way of example only, WLAN stations, wireless personal network (WPAN), and the like.

Figure 1:
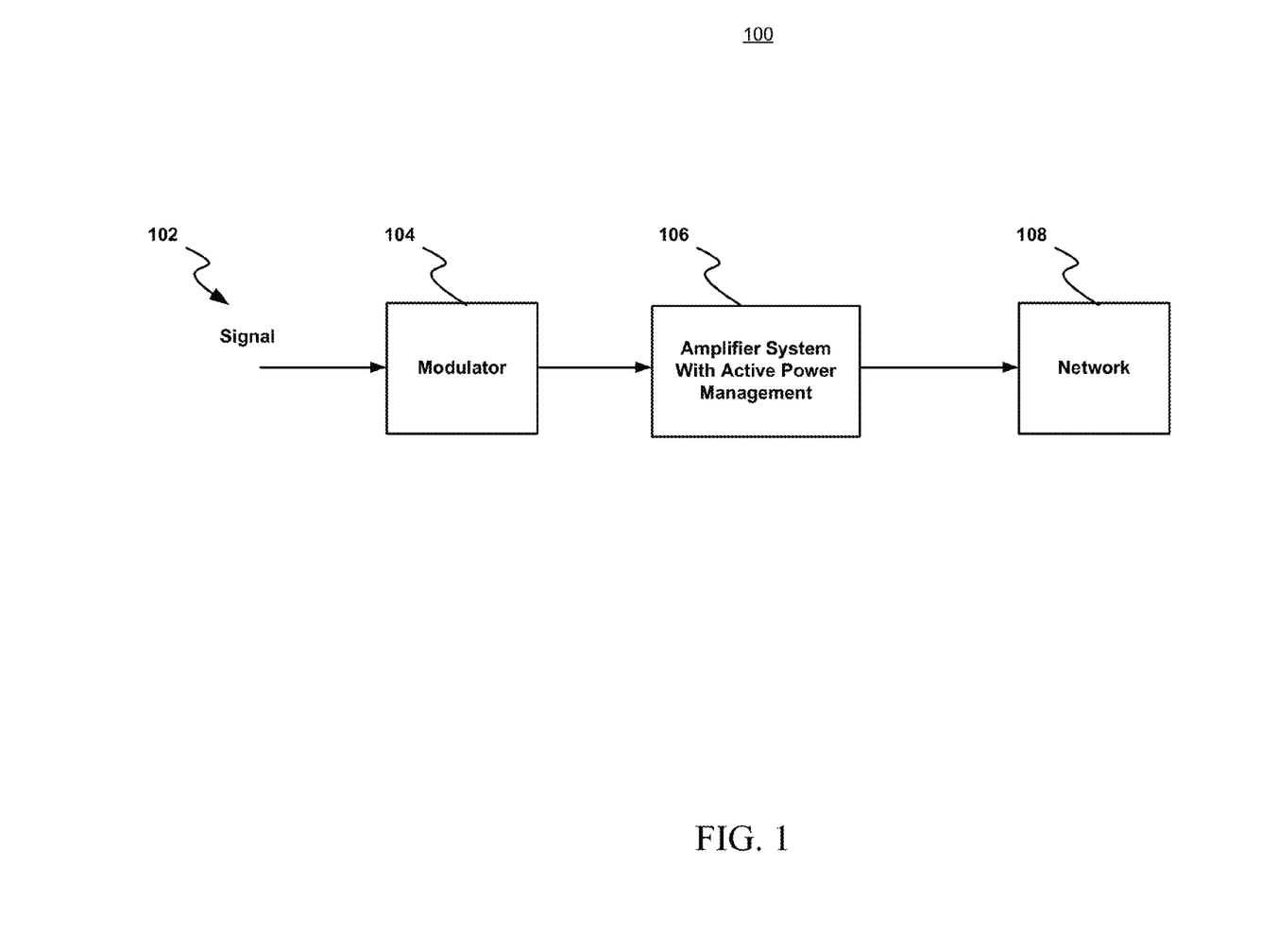
FIG. 1 illustrates a top level system diagram of one exemplary embodiment consistent with the present disclosure.

FIG. 1 illustrates a top level system diagram 100 of one exemplary embodiment consistent with the present disclosure. A signal to be transmitted 102 is provided to a modulator circuit 104 where a carrier wave is modulated by the signal 102. The modulated carrier wave is then amplified by an amplifier system with active power management 106, the operation of which will be explained in greater detail below. The amplified signal may then be transmitted to a network 108 which may be a wireless network, a cable network or any network that operates at variable transmission power levels. In some embodiments, the network interface may be a cable network configured with a 75 ohm or 50 ohm characteristic impedance.

Figure 2:
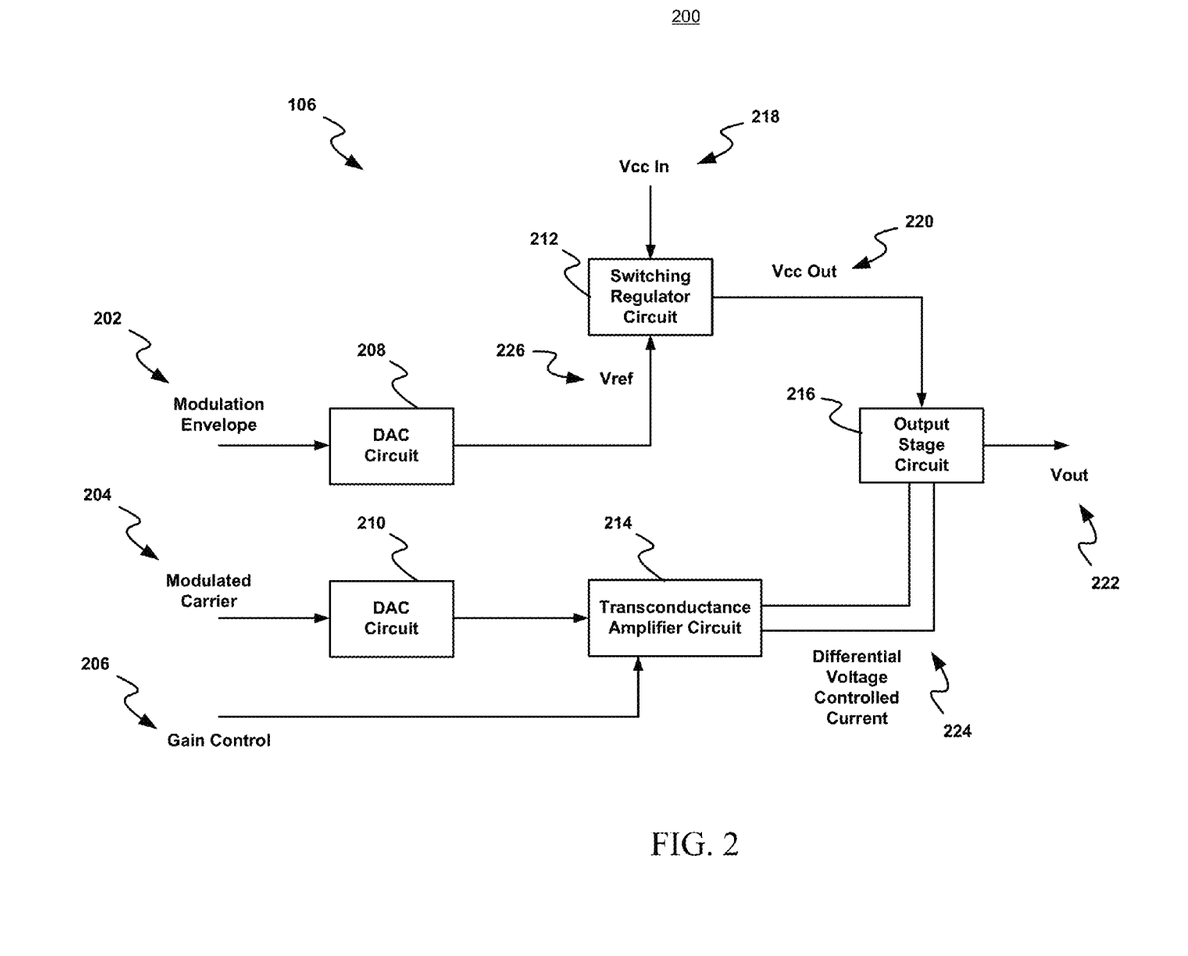
FIG. 2 illustrates a block diagram of one exemplary embodiment consistent with the present disclosure.

FIG. 2 illustrates a block diagram 200 of one exemplary embodiment consistent with the present disclosure. A modulated carrier signal 204 is provided from modulator 104 to digital to analog converter (DAC) circuit 210 and then to transconductance amplifier circuit 214. Transconductance amplifier circuit 214 is a voltage controlled current source with an adjustable gain that may be controlled by gain control signal 206. The output of transconductance amplifier circuit 214, in this embodiment, is a differential voltage controlled current 224 that is proportional to the modulated carrier signal 204 and to the gain control signal 206. In other embodiments, alternate amplifier circuits maybe employed which may have single-ended outputs or other suitable types of output configurations. The term differential output, as used herein, means that there are two output lines with complimentary signals, which is to say that each line conducts a current of equal magnitude to the other, but in the opposite direction of the other. The transconductance amplifier circuit 214 controls the output stage circuit 216 by sourcing these differential currents into loads in the output stage circuit 216, as will be explained in greater detail below. The output stage circuit 216 generates an output voltage Vout 222 based on an amplified version of modulated carrier signal 204 which is provided to network 108.

A modulation envelope signal 202 is also provided by modulator 104, or other circuitry associated with the transmitter system. The modulation envelope may be a full wave rectified envelope of the modulated carrier signal 204. The modulation envelope is converted to an analog signal by DAC circuit 208 and then provided as a voltage reference input, Vref 226, to switching regulator circuit 212. Switching regulator circuit 212 may be configured to provide a supply voltage Vcc Out 220 to output stage circuit 216. Switching regulator circuit 212, which in some embodiments may be a Buck converter, a Boost converter or a Buck-Boost converter, converts its own supply voltage, Vcc In 218, to the output supply voltage, Vcc Out 220, based on the voltage reference input, Vref 226, which, in this case, is the modulation envelope. Thus, when the system is transmitting at reduced amplitudes or not transmitting at all, such as in a time multiplexed transmission mode, the modulation envelope will decrease and the supply voltage to the output stage will decrease resulting in a reduced average power consumption.

The switching regulator circuit 212 may have an analog or a digital control loop. The bandwidth of the control loop should preferably be greater than the bandwidth of the modulation envelope so that the output voltage, Vcc Out 220, may vary in response to the voltage reference input Vref 226. In some embodiments, the switching regulator circuit 212 may incorporate a DAC, in which case, the modulation envelope signal 202 may be provided directly to switching regulator voltage reference input 226 in digital form.

In some embodiments, the modulation envelope 202 may contain predistortion to compensate for non-linearities in the switching regulator control loop. The compensation may be predefined or generated by a power-up calibration procedure.

Figure 3:
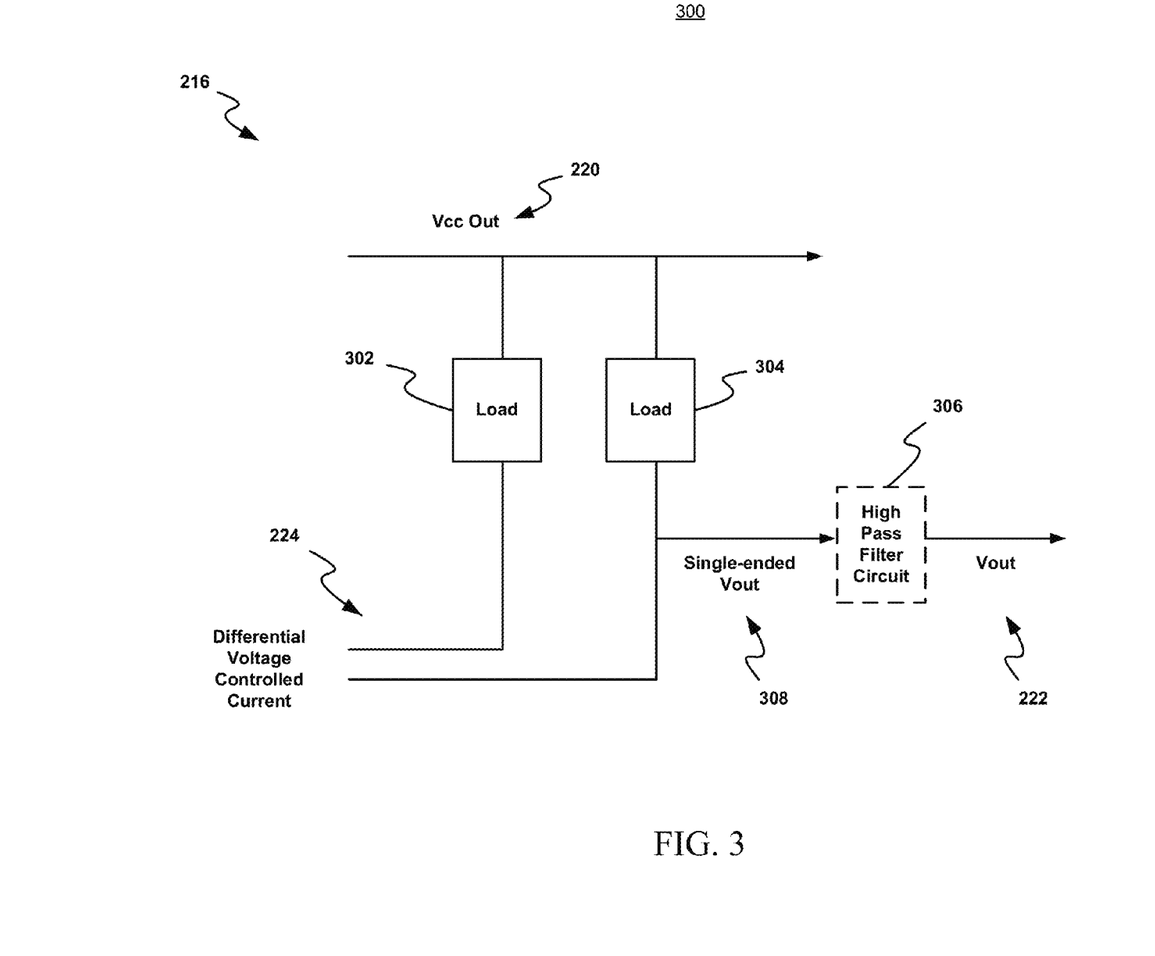
FIG. 3 illustrates a more detailed block diagram of one exemplary embodiment consistent with the present disclosure.

FIG. 3 illustrates a more detailed block diagram 300 of one exemplary embodiment consistent with the present disclosure. An embodiment of the output stage circuit 216 producing a single-ended voltage output is shown to include balanced loads 302 and 304 (i.e., loads 302 and 304 have substantially equal impedance). Load 302 is coupled between Vcc Out 220 and one of the differential voltage controlled current lines 224. Load 304 is coupled between Vcc Out 220 and the other of the differential voltage controlled current lines 224. A single-ended output voltage is tapped off of the load 304. This voltage will vary from Vcc Out 220 depending on the current drawn through the load 304 by transconductance amplifier circuit 214 and will therefore be a representation of modulated carrier signal 204. Vcc Out 220, however, will also be varying in response to the modulation envelope signal 202, resulting in a power savings during periods when the envelope decreases. In some embodiments, an optional high pass filter circuit 306 (or equivalently, a tuned output load) may be employed to remove the additional envelope modulation that is introduced onto the output signal during this process.

Figure 4:
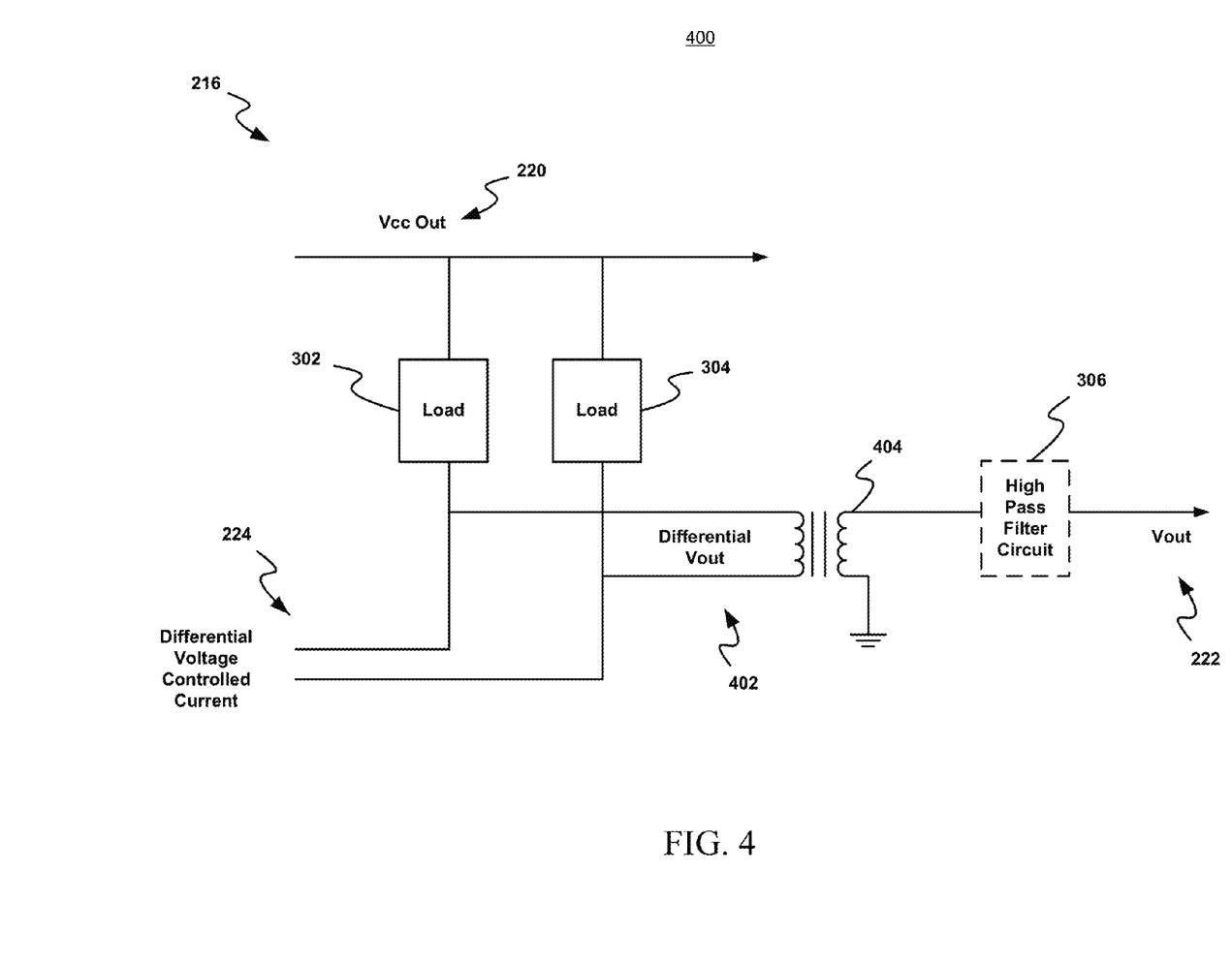
FIG. 4 illustrates a more detailed block diagram of another exemplary embodiment consistent with the present disclosure.

FIG. 4 illustrates a more detailed block diagram 400 of another exemplary embodiment consistent with the present disclosure. In this embodiment, the output stage circuit 216 produces a differential voltage output 402 by tapping off both loads 302 and 304. The differential voltage output 402 is then converted to a single-ended output voltage by transformer 404 before being passed through optional high pass filter circuit 306. Alternative embodiments may employ any other suitable output stage circuit configuration that delivers current to a load.

In some embodiments, the Vcc Out 220 voltage may be set to a minimum DC voltage offset corresponding to a condition where no output signal is generated. This is the minimum voltage needed to avoid saturation of the transconductance amplifier circuit 214 and would thus be the minimum voltage provided by the switching regulator circuit 212. In a preferable embodiment, the ratio of the envelope modulation 202 to the Vcc Out 220 modulation is 1 to 1 to maintain a minimum voltage on the transconductance output.

Figure 5:
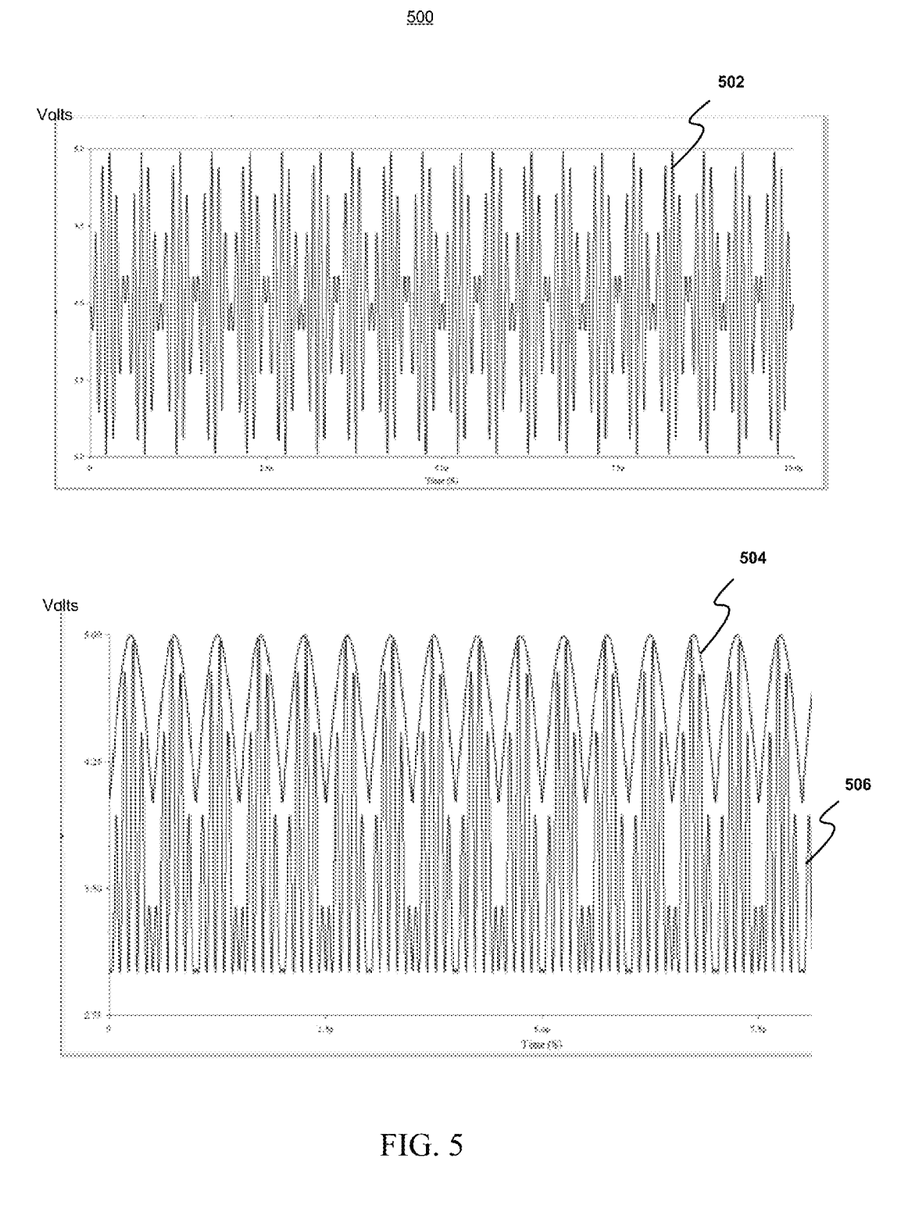
FIG. 5 illustrates signal plots for processing by an exemplary embodiment consistent with the present disclosure.

FIG. 5 illustrates signal plots 500 for processing by an exemplary embodiment consistent with the present disclosure. Shown are an example modulated carrier signal 502, a full-wave rectified version 506 of the modulated carrier signal, and an envelope 504 of the full-wave rectified modulated carrier signal.

Figure 6:
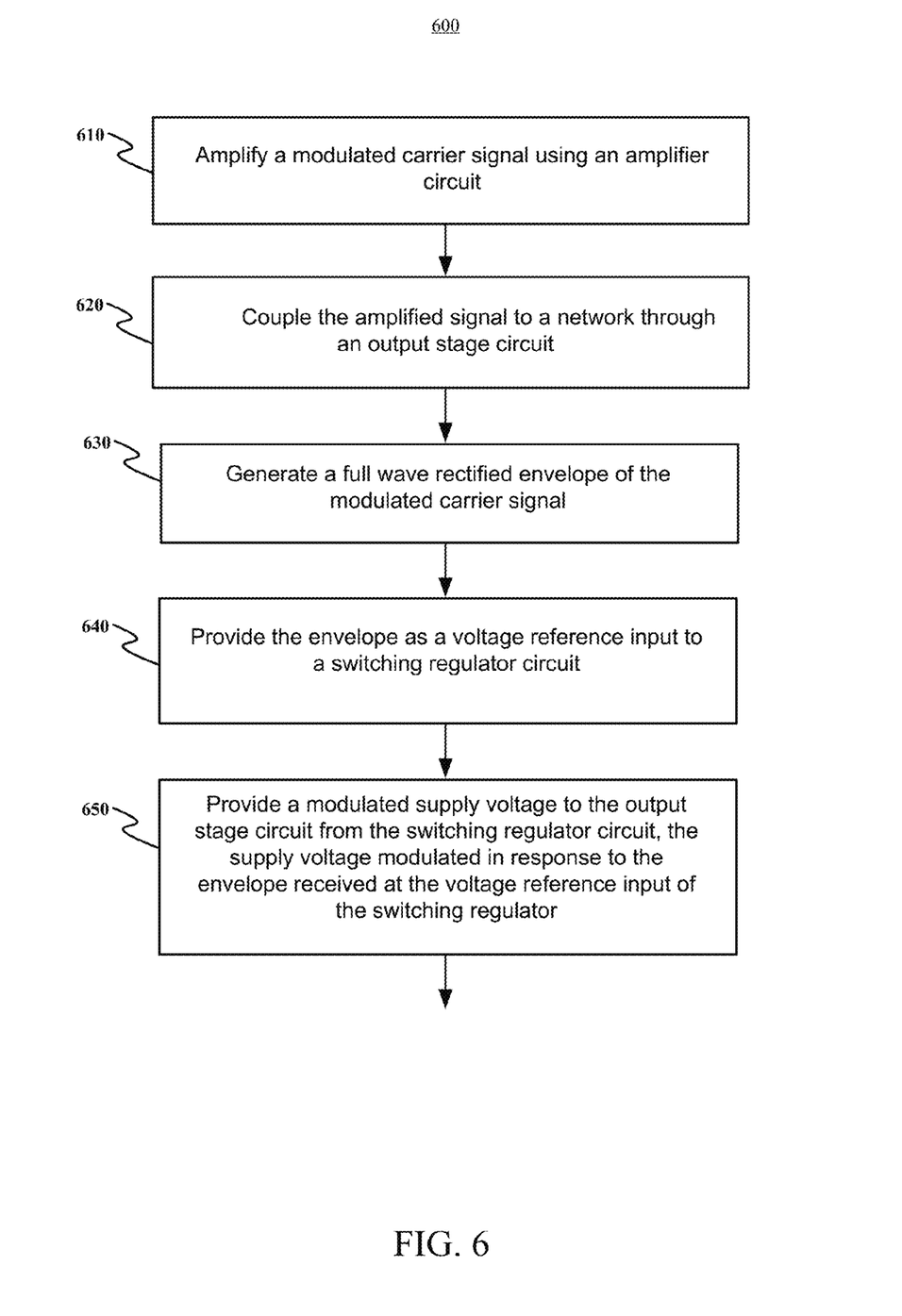
FIG. 6 illustrates a flowchart of operations of an exemplary embodiment consistent with the present disclosure.

FIG. 6 illustrates a flowchart of operations 600 of an exemplary embodiment consistent with the present disclosure. At operation 610, a modulated carrier signal is amplified by an amplifier circuit. In some embodiments, the amplifier circuit maybe a transconductance amplifier. At operation 620, the amplified signal is coupled to a network through an output stage circuit. At operation 630, a full wave rectified envelope of the modulated carrier signal is generated. At operation 640, the envelope is provided as a voltage reference input to a switching regulator circuit. At operation 650, a modulated supply voltage is provided to the output stage circuit from the switching regulator circuit. The supply voltage is modulated in response to the envelope received at the voltage reference input of the switching regulator.

Figure 7:
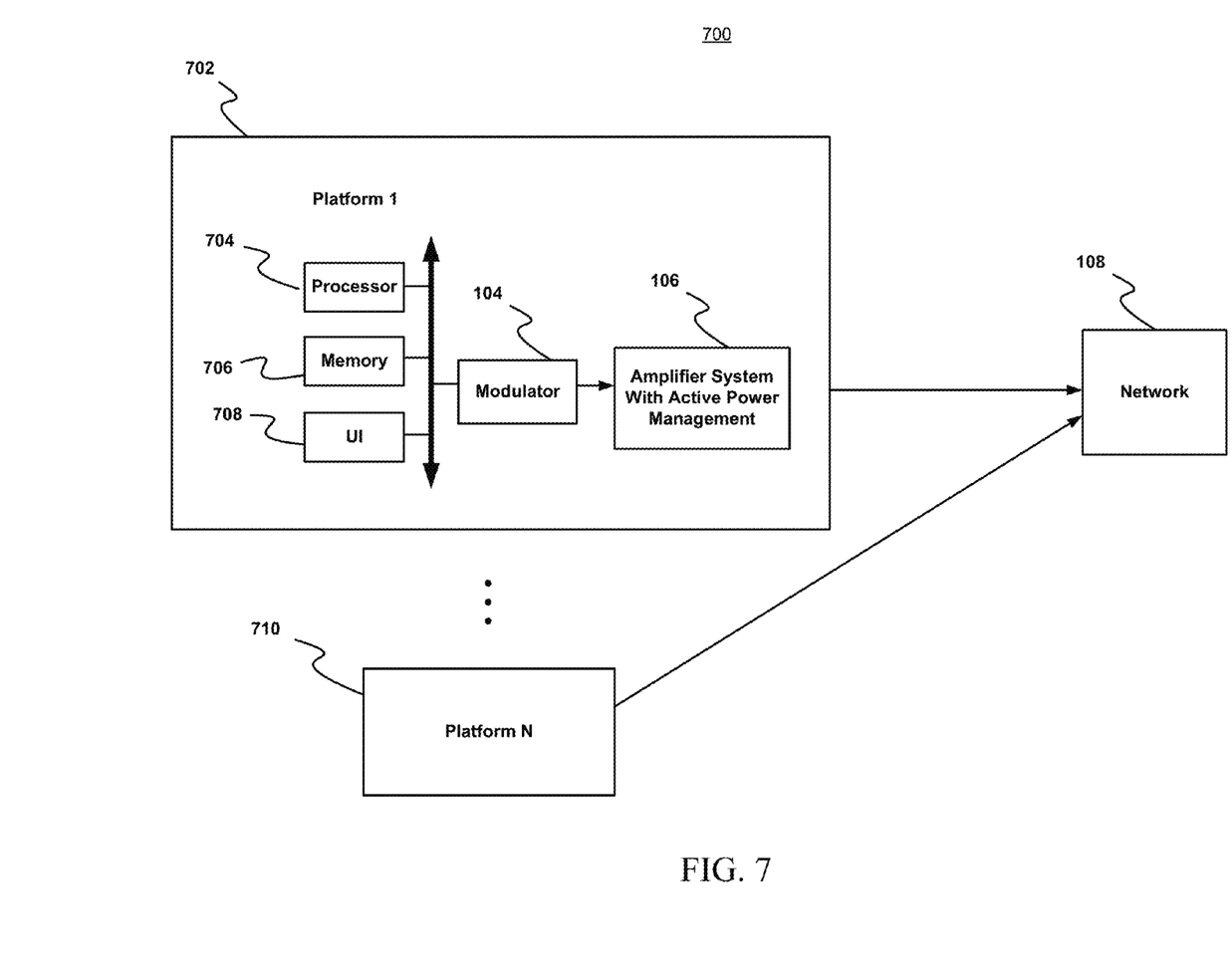
FIG. 7 illustrates a system diagram showing platforms consistent with an exemplary embodiment of the present disclosure in a network.

FIG. 7 illustrates a system diagram 700 showing platforms consistent with an exemplary embodiment of the present disclosure in a network. A platform 702, 710 may be a device, such as, for example, a smartphone, a tablet, a digital television, a laptop computing device or any other device configured to transmit modulated signals. Platforms 702, 710 may comprise a processor 704, memory 706, a user interface (UI) 708 one or more modulators 104 configured to modulate a carrier signal and one or more amplifier systems with active power management 106. In some embodiments, the user interface may be a touchscreen. Any number of platforms 702, 710 may transmit signals over a network 108. In some embodiments, network 108 may be a Wireless Metropolitan Area Network (WMAN), a Wireless Metropolitan Area Network (WMAN), a digital television network or any network that operates at variable transmission power levels.

Embodiments of the methods described herein may be implemented in a system that includes one or more storage mediums having stored thereon, individually or in combination, instructions that when executed by one or more processors perform the methods. Here, the processor may include, for example, a system CPU (e.g., core processor) and/or programmable circuitry. Thus, it is intended that operations according to the methods described herein may be distributed across a plurality of physical devices, such as processing structures at several different physical locations. Also, it is intended that the method operations may be performed individually or in a subcombination, as would be understood by one skilled in the art. Thus, not all of the operations of each of the flow charts need to be performed, and the present disclosure expressly intends that all subcombinations of such operations are enabled as would be understood by one of ordinary skill in the art.

The storage medium may include any type of tangible medium, for example, any type of disk including floppy disks, optical disks, compact disk read-only memories (CD-ROMs), compact disk rewritables (CD-RWs), digital versatile disks (DVDs) and magneto-optical disks, semiconductor devices such as read-only memories (ROMs), random access memories (RAMs) such as dynamic and static RAMs, erasable programmable read-only memories (EPROMs), electrically erasable programmable read-only memories (EEPROMs), flash memories, magnetic or optical cards, or any type of media suitable for storing electronic instructions.

"Circuitry", as used in any embodiment herein, may comprise, for example, singly or in any combination, hard-wired circuitry, programmable circuitry, state machine circuitry, and/or firmware that stores instructions executed by programmable circuitry.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents. Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications.

What is claimed is:

1. A system for amplifying a signal with active power management, said system comprising:
    a first digital to analog converter (DAC) circuit to provide a modulated carrier signal;
    an amplifier circuit coupled to said first DAC, said amplifier circuit to amplify said modulated carrier signal by providing a differential voltage controlled current that is proportional to said modulated carrier signal and a gain control signal;
    an output stage circuit coupled to said amplifier circuit, said output stage circuit to provide said amplified signal to a network;
    a second DAC circuit to provide a full wave rectified envelope of said modulated carrier signal; and
    a switching regulator circuit comprising a voltage reference input coupled to said second DAC circuit, said switching regulator circuit to provide a supply voltage to said output stage circuit, said supply voltage modulated in response to said envelope received at said voltage reference input.

2. The system of claim 1, wherein said amplifier circuit is a transconductance stage amplifier circuit.

3. The system of claim 1, wherein said second DAC circuit is integrated in said switching regulator circuit.

4. The system of claim 1, further comprising a variable gain circuit coupled to said amplifier circuit, said variable gain circuit to adjust a gain of said modulated carrier signal in response to said gain control signal.

5. The system of claim 1, wherein said switching regulator circuit further comprises a control loop, said control loop having a loop bandwidth that exceeds the bandwidth of said envelope.

6. The system of claim 5, wherein said envelope may comprise predistortion, said predistortion generated to compensate for non-linearities in said control loop.

7. The system of claim 1, wherein said switching regulator circuit is a Buck converter.

8. The system of claim 1, wherein said switching regulator circuit is a Boost converter.

9. The system of claim 1, wherein said switching regulator circuit is a Buck-Boost converter.

10. The system of claim 1, wherein said output stage circuit comprises a transformer circuit, said transformer circuit to convert said amplified signal from a differential signal to a single-ended signal.

11. The system of claim 1, wherein said output stage circuit comprises a high-pass filter to remove envelope modulation from said amplified signal.

12. A method for amplifying a signal with active power management, said method comprising:
amplifying a modulated carrier signal using an amplifier circuit by providing a differential voltage controlled current that is proportional to said modulated carrier signal and a gain control signal;
coupling said amplified signal to a network through an output stage circuit;
generating a full wave rectified envelope of said modulated carrier signal;
providing said envelope as a voltage reference input to a switching regulator circuit; and
providing a modulated supply voltage to said output stage circuit from said switching regulator circuit, said supply voltage modulated in response to said envelope received at said voltage reference input of said switching regulator.

13. The method of claim 12, wherein said amplifier circuit is a transconductance stage amplifier circuit.

14. The method of claim 12, further comprising adjusting a gain of said modulated carrier signal in response to said gain control signal.

15. The method of claim 12, further comprising configuring a control loop in said switching regulator circuit such that the bandwidth of said control loop exceeds the bandwidth of said envelope.

16. The method of claim 15, further comprising generating predistortion in said envelope to compensate for non-linearities in said control loop.

17. The method of claim 12, wherein said switching regulator circuit is a Buck converter.

18. The method of claim 12, wherein said switching regulator circuit is a Boost converter.

19. The method of claim 12, wherein said switching regulator circuit is a Buck-Boost converter.

20. The method of claim 12, further comprising converting said amplified signal from a differential signal to a single-ended signal using a transformer circuit.

21. The method of claim 12, further comprising high-pass filtering said amplified signal to remove envelope modulation from said amplified signal.

22. A system for amplifying a signal with active power management for transmission in a network, said system comprising:
a platform including a processor, memory coupled to said processor and a user interface coupled to said processor;
one or more signal modulators coupled to said processor; and
one or more amplifier systems coupling said modulators to said network, said amplifier systems comprising:
a first digital to analog converter (DAC) circuit to provide a modulated carrier signal;
an amplifier circuit coupled to said first DAC, said amplifier circuit to amplify said modulated carrier signal by providing a differential voltage controlled current that is proportional to said modulated carrier signal and a gain control signal;
an output stage circuit coupled to said amplifier circuit, said output stage circuit to provide said amplified signal to said network;
a second DAC circuit to provide a full wave rectified envelope of said modulated carrier signal; and
a switching regulator circuit comprising a voltage reference input coupled to said second DAC circuit, said switching regulator circuit to provide a supply voltage to said output stage circuit, said supply voltage modulated in response to said envelope received at said voltage reference input.

23. The system of claim 22, further comprising a variable gain circuit coupled to said amplifier circuit, said variable gain circuit to adjust a gain of said modulated carrier signal in response to said gain control signal.

24. The system of claim 22, wherein said switching regulator circuit further comprises a control loop, said control loop with a loop bandwidth that exceeds the bandwidth of said envelope.

25. The system of claim 22, wherein said switching regulator circuit is a Buck converter.

26. The system of claim 22, wherein said switching regulator circuit is a Boost converter.

27. The system of claim 22, wherein said switching regulator circuit is a Buck-Boost converter.

28. The system of claim 22, wherein said output stage circuit comprises a transformer circuit, said transformer circuit to convert said amplified signal from a differential signal to a single-ended signal.

29. The system of claim 22, wherein said output stage circuit comprises a high-pass filter to remove envelope modulation from said amplified signal.

30. The system of claim 22, wherein said platform is one of a smartphone, a tablet, a digital television or a laptop computing device.

31. The system of claim 22, wherein said user interface is a touchscreen.

32. The system of claim 22, further comprising a plurality of said platforms each to communicate over a said network.

33. The system of claim 22, wherein said network is a Wireless Wide Area Network (WWAN).

34. The system of claim 22, wherein said network is a Wireless Metropolitan Area Network (WMAN).

35. The system of claim 22, wherein said network is a digital television network.

36. The system of claim 22, wherein said network operates at variable transmission power levels.

* * * * *